(12) United States Patent
Miyagi

(10) Patent No.: US 8,363,725 B2
(45) Date of Patent: Jan. 29, 2013

(54) METHOD AND APPARATUS FOR VLC ENCODING IN A VIDEO ENCODING SYSTEM

(75) Inventor: Kensuke Miyagi, Cupertino, CA (US)

(73) Assignees: Sony Corporation, Minato-Ku, Tokyo (JP); Sony Electronics Inc., Park Ridge, NJ (US)

( * ) Notice: Subject to any disclaimer, the term of this patent is extended or adjusted under 35 U.S.C. 154(b) by 1178 days.

(21) Appl. No.: 12/206,654

(22) Filed: Sep. 8, 2008

(65) Prior Publication Data

US 2010/0061457 A1     Mar. 11, 2010

(51) Int. Cl.
*H04N 11/04* (2006.01)

(52) U.S. Cl. ............. 375/240.16; 375/240.23; 341/59; 341/65; 341/67

(58) Field of Classification Search .......... 375/240.16, 375/240.23; 341/59, 65, 67; 314/59, 65, 314/67
See application file for complete search history.

(56) References Cited

U.S. PATENT DOCUMENTS

| | | | |
|---|---|---|---|
| 5,541,595 A | 7/1996 | Meyer | |
| 5,650,782 A | 7/1997 | Kim | |
| 5,835,145 A * | 11/1998 | Ouyang et al. | 375/240.2 |
| 6,292,114 B1 | 9/2001 | Tsai et al. | |
| 6,546,053 B1 * | 4/2003 | Ishii | 375/240.27 |
| 7,113,115 B2 | 9/2006 | Partiwala et al. | |
| 7,248,191 B2 * | 7/2007 | Tanaka et al. | 341/67 |
| 2004/0233076 A1 | 11/2004 | Zhou | |
| 2006/0001555 A1 | 1/2006 | Partiwala et al. | |
| 2006/0055571 A1 * | 3/2006 | Nagata et al. | 341/67 |

FOREIGN PATENT DOCUMENTS

JP     6237184     2/1993

OTHER PUBLICATIONS

GB Search Report, Nov. 27, 2009 for Application No. GB0915590.4.

* cited by examiner

*Primary Examiner* — Thanhnga B Truong
*Assistant Examiner* — Josnel Jeudy
(74) *Attorney, Agent, or Firm* — Moser Taboada

(57) ABSTRACT

Method and apparatus for variable length code (VLC) encoding is described. In some examples, a symbol of frequency transform values having a run and a level is VLC encoded. An address is generated, at a processor, for a lookup table (LUT) in a memory based on the run and the level, the LUT storing VLC entries for all possible combinations of run values ranging from minimum to maximum runs and level values ranging from minimum to maximum levels, each of the VLC entries including a flag indicative of an escape mode. A VLC entry is read from the LUT using the address. A VLC code and bit length are obtained from the VLC entry if the flag in the VLC entry is a first value. A fixed length VLC code is generated from an escape code, the run, and the level if the flag in the VLC entry is a second value.

14 Claims, 4 Drawing Sheets

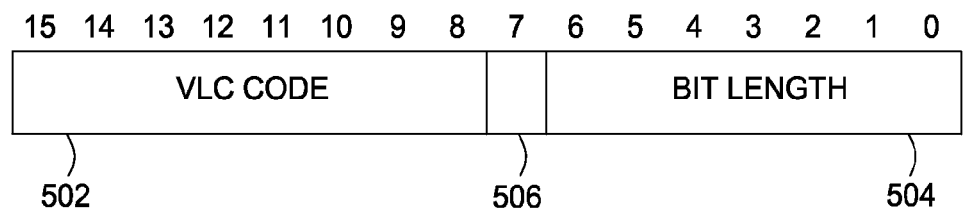
FIG. 5
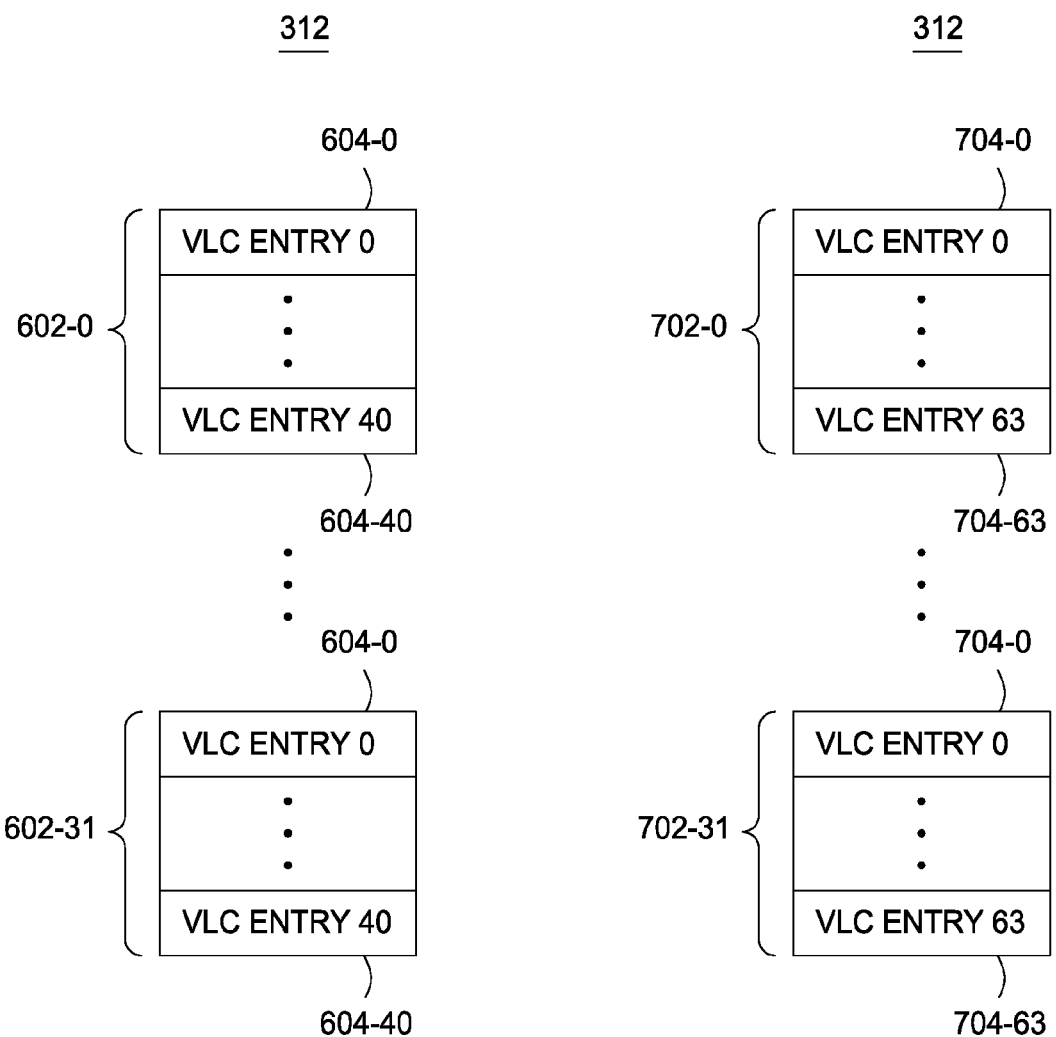
FIG. 6
FIG. 7

METHOD AND APPARATUS FOR VLC ENCODING IN A VIDEO ENCODING SYSTEM

BACKGROUND OF THE INVENTION

1. Field of the Invention

The present invention relates generally to video encoding. More particularly, the present invention relates to a method and apparatus for VLC encoding in a video encoding system.

2. Description of the Related Art

Video compression is used in many current and emerging products, such as digital television set-top boxes (STBs), high definition television (HDTV) decoders, digital versatile disk (DVD) players, BLU-RAY disc players, digital camcorders, personal computers, and the like. Without video compression, digital video content can be extremely large, making it difficult or even impossible for the digital video content to be efficiently stored, transmitted, or viewed. There are numerous video coding methods that compress digital video content. Consequently, video coding standards have been developed to standardize the various video coding methods so that the compressed digital video content is rendered in formats that a majority of video decoders can recognize. For example, the Motion Picture Experts Group (MPEG) and International Telecommunication Union (ITU-T) have developed video coding standards that are in wide use. Examples of these standards include the MPEG-1, MPEG-2 (ITU-T H.262), MPEG-4, ITU-T H.261, and ITU-T H.263 standards.

Video compression, such as MPEG, processes input video information using block-based frequency transform coding (e.g., discrete cosine transform (DCT)) and motion-compensated prediction to produce frequency coefficients and motion vectors. Blocks of frequency coefficients are quantized and scanned in a defined scan order to produce a serial stream of frequency coefficients. The frequency coefficients, along with the motion vectors, are then processed using variable length code (VLC) encoding to produce an encoded video stream. VLC is a coding mechanism that assigns shorter code-words to frequent events, and longer code-words to less frequent events.

Notably, blocks of frequency coefficients typically include one or more non-zero coefficients and many zero-valued coefficients. When scanned, the frequency coefficients result non-zero coefficients separated by a sequence of zero coefficients. In MPEG terms, a "run" is defined as the number of zero-valued coefficients preceding a non-zero coefficient in the scan-order. A "level" is defined as the absolute value of the non-zero coefficient that occurs after the run. A VLC codeword is generated for each run and level combination. In MPEG, a run value can range between 0 and 63 and a level can range between 1 and 2047. MPEG standards specifically define some VLC codewords for run/level combinations that statistically occur frequently (e.g., MPEG-2 defines 113 VLC codewords for particular run/level combinations). For run/level combinations not having specifically defined codewords, the VLC codeword is a fixed codeword including a concatenation of a defined escape sequence, the run, and the level.

In some applications, such as in digital camcorders and personal computers, video compression is performed at least partially using processor-based encoding algorithms. For example, VLC encoding may be performed using a processor that executes instructions. Processor-based encoding algorithms typically employ VLC encoding using lookup tables. For example, FIG. 1 depicts a typical MPEG-2 VLC encoding algorithm. At step 102, a run and level are determined. At step 104, a determination is made whether the run is greater than a maximum run. In MPEG-2, specific VLC codewords are provided for runs between 0 and 31. Any run value greater than 31 is coded using the escape code. Thus, if the run is greater than the maximum run, the method 100 proceeds to step 106, where the escape code is generated. Otherwise, the method 100 proceeds to step 108, where the run is used to query a lookup table to obtain a maximum level for the run. MPEG-2 defines different maximum level values depending on the value of the run. At step 110, a determination is made whether the level is greater than the maximum level for the run. If so, the method 100 proceeds to step 106, where the escape code is generated. Otherwise, the method 100 proceeds to step 112. At step 112, a VLC codeword is selected by first selecting a lookup table corresponding to the run (there are multiple lookup tables, one for each run value), and then querying the selected lookup table with the level value to get the VLC codeword.

The problem with the VLC encoding method in FIG. 1 is that the method requires a processor to perform three load instructions: one load instruction for obtaining the maximum level at step 108, and two load instructions for selecting the lookup table for the run and for loading the VLC codeword given the level at step 112. In a typical processor environment, a load instruction may take two clock cycles, thus requiring six clock cycles for the three load instructions. To illustrate the problem, assume standard definition (SD) video of 720×480 pixels at 30 frames per second with an average of 50% non-zero coefficients and being represented in 4:2:0 chrominance format. Since there are 720×480×1.5×30×50%=7,776,000 coefficients, the processor will require 7,776,000×6=46,656,000 clock cycles just for the load instructions in VLC encoding one second of video. Note the factor of 1.5 is due to the 4:2:0 chrominance format and is even higher for other chrominance formats (e.g., 4:2:2 or 4:4:4). Thus, the VLC encoding method in FIG. 1 exhibits a high cost in terms of processor cycles and is inefficient.

Accordingly, there exists a need in the art for a method and apparatus for VLC encoding in a video encoding system that reduces the number of required load instructions.

SUMMARY OF THE INVENTION

An aspect of the invention relates to a method of variable length code (VLC) encoding a symbol of frequency transform values having a run and a level in a video encoding system. In some embodiments, the method includes generating, at a processor, an address for a lookup table stored in a memory based on the run and the level, the lookup table storing VLC entries for all possible combinations of run values ranging from a minimum run to a maximum run and level values ranging from a minimum level to a maximum level, each of the VLC entries including a flag indicative of an escape mode. A VLC entry is read from the lookup table using the address. A VLC code and bit length are obtained from the VLC entry if the flag in the VLC entry is a first value. A fixed length VLC code is generated from an escape code, the run, and the level if the flag in the VLC entry is a second value.

Another aspect of the invention relates to an apparatus for VLC encoding of a symbol of frequency transform values having a run and a level in a video compression system. In some embodiments, a memory is provided having a lookup table configured to store VLC entries for all possible combinations of run values ranging from a minimum run to a maximum run and level values ranging from a minimum level to a maximum level, each of the VLC entries including a flag indicative of an escape code. A processor, coupled to the memory, is provided and configured to generate an address for the lookup table based on the run and the level, read a VLC entry from the lookup table using the address, obtain a VLC code and bit length from the VLC entry if the flag in the VLC entry is a first value; and generate a fixed length VLC code from an escape code, the run, and the level if the flag in the VLC entry is a second value.

Another aspect of the invention relates to a video compression system. In some embodiments, frequency transform/motion prediction logic is provided configured to produce frequency transform values from video data. A VLC encoder, coupled to the encoder logic, is provided and configured to encode symbols of the frequency transform values each having a run and a level. The VLC encoder includes: a lookup table configured to store VLC entries for all possible combinations of run values ranging from a minimum run to a maximum run and level values ranging from a minimum level to a maximum level, each of the VLC entries including a flag indicative of an escape code; and a processor configured to, for each symbol of the symbols: generate an address for the lookup table based on the run and the level of the symbol, read a VLC entry from the lookup table using the address, obtain a VLC code and bit length from the VLC entry if the flag in the VLC entry is a first value; and generate a fixed length VLC code from an escape code, the run of the symbol, and the level of the symbol if the flag in the VLC entry is a second value.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 5 depicts an exemplary embodiment of a VLC entry in accordance with one or more aspects of the invention;

FIG. 6 depicts an exemplary embodiment of a lookup table in accordance with one or more aspects of the invention; and FIG. 7 depicts another exemplary embodiment of a lookup table in accordance with one or more aspects of the invention.

DETAILED DESCRIPTION

Figure 2:
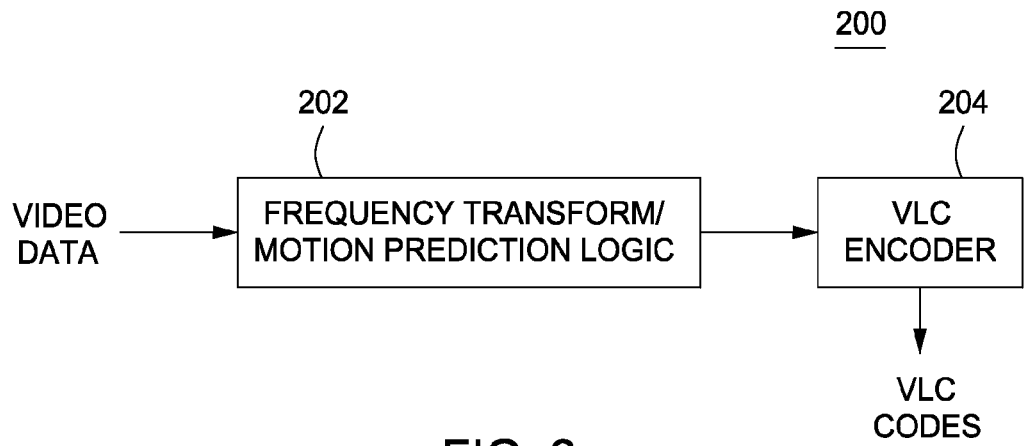
FIG. 2 is a block diagram depicting an exemplary embodiment of a video encoding system in accordance with one or more aspects of the invention.

FIG. 2 is a block diagram depicting an exemplary embodiment of a video encoding system 200 in accordance with one or more aspects of the invention. The video encoding system 200 includes frequency transform/motion prediction logic 202 coupled to a variable length code (VLC) encoder 204. The frequency transform/motion prediction logic 202 is configured to receive video data comprising a sequence of images (e.g., frames). The frequency transform/motion prediction logic 202 performs block-based frequency transform coding (e.g., discrete cosine transform (DCT) or the like) and motion-compensated prediction to produce blocks of frequency coefficients and motion vectors. The frequency transform/motion prediction logic 202 quantizes the frequency coefficients, scans them in a defined scanning order, and outputs a stream of frequency coefficients along with the motion vectors. The frequency transformation/motion prediction logic 202 may include well-known logic for performing the aforementioned functions in accordance with various standards, such as MPEG, MPEG-2, MPEG-4, and the like.

The VLC encoder 204 receives the frequency coefficients and motion vectors from the frequency transform/motion prediction logic 202. The VLC encoder 204 encodes the frequency coefficients and the motion vectors to produce a stream of VLC codes as output. In particular, the VLC encoder 204 run-length encodes at least a portion of frequency coefficients to produce a sequence of symbols. A symbol is an event that includes a run and a level. As described above, a "run" is defined as the number of zero-valued coefficients preceding a non-zero coefficient in the scan-order. A "level" is defined as the absolute value of the non-zero coefficient that occurs after the run. The symbols are then encoded to produce VLC codes.

As is known in the art, some standards, such as the MPEG standards, produce both intra-predicted and inter-predicted frames, each including a DC coefficient and a plurality of AC coefficients. In some cases, DC coefficients in an intra-predicted are not run-length encoded, but rather include predefined VLC codes. For example, MPEG-2 as defined in ISO/IEC 13818-2 specifies VLC codes for DC coefficients in intra-predicted frames in tables B.12 and B.13. All other coefficients are run-length encoded to produce symbols. Furthermore, as described above, some symbols include predefined VLC codes. For example, MPEG-2 as defined in ISO/IEC 13818-2 specifies VLC codes for particular run/length combinations in tables B.14 and B.15. Each symbol having a run/length combination that does not have a specific defined VLC code is coded using a fixed length code. The fixed length code includes a concatenation of a predefined escape code, the run, and the level. Exemplary embodiments of a method for VLC encoding a symbol of frequency transform values having a run and a level are described below. While MPEG-2 is described as an example, those skilled in the art will appreciate that other standards, including MPEG-1 and MPEG-4 standards, include similar predefined VLC codes for particular coefficients/symbols.

Figure 3:
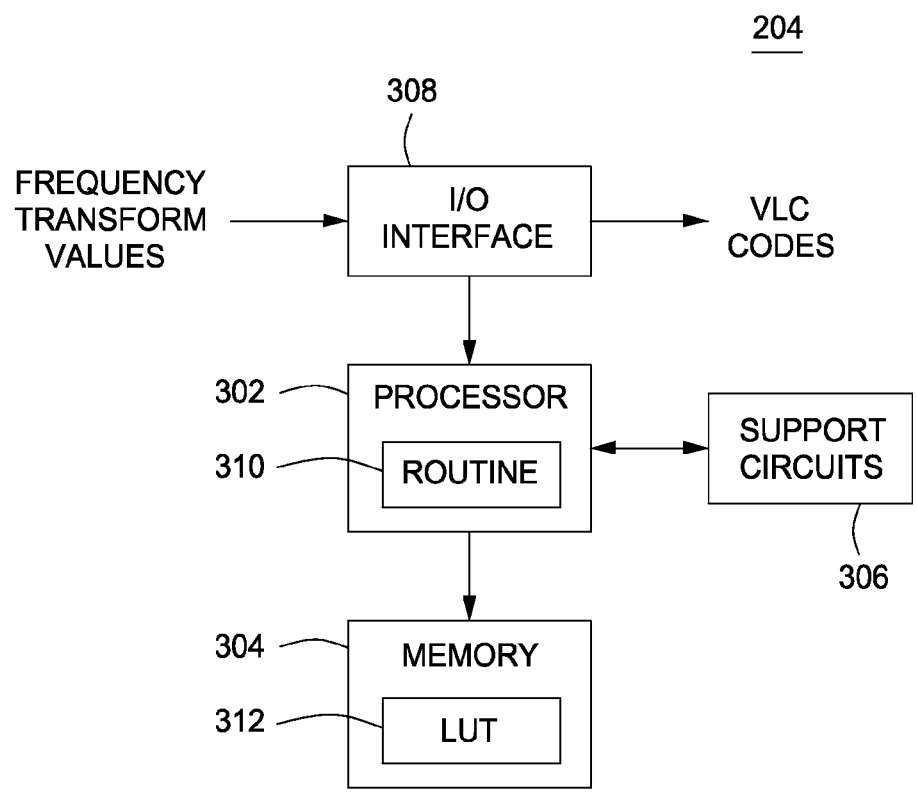
FIG. 3 is a block diagram depicting an exemplary embodiment of a VLC encoder in accordance with one or more aspects of the invention.

FIG. 3 is a block diagram depicting an exemplary embodiment of the VLC encoder 204 in accordance with one or more aspects of the invention. The VLC encoder 204 includes a processor 302, a memory 304, support circuits 306, an I/O interface 308. The processor 302 may include one or more microprocessors, microcontrollers, specific-purpose processors, or the like known in the art. The support circuits 306 for the processor 302 include conventional cache, power supplies, clock circuits, data registers, I/O interfaces, and the like. The I/O interface 308 may be directly coupled to the memory 304 or coupled through the processor 302. The I/O interface 308 is configured to receive frequency transform values to be VLC encoded and to output VLC codes. The memory 304 may include random access memory, read only memory, magnetic read/write memory, and the like. The VLC encoder 204 may be implemented using various configurations, such as discrete components or using one or more integrated circuits, such as an application specific integrated circuit (ASIC), field programmable gate array (FPGA), or the like.

Figure 1:
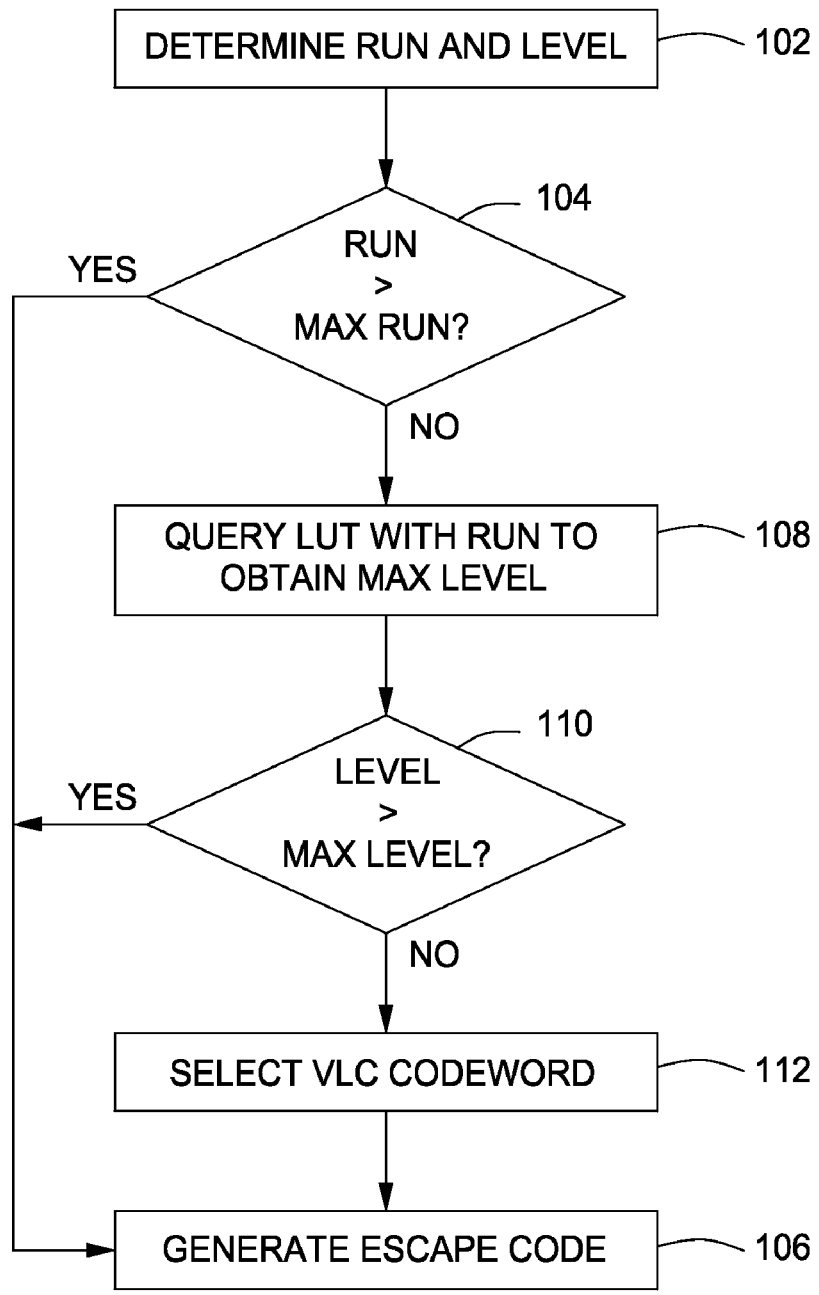
FIG. 1 depicts a typical MPEG-2 variable length code (VLC) encoding algorithm.

The processor 302 is configured to execute a routine 310, which causes the VLC encoder 204 to perform VLC encoding of the input frequency transform values. The memory 304 is configured to store a lookup table 312, which is configured to reduce the number of load instructions required by the processor 302 as compared to the use of multiple lookup tables are described in FIG. 1. In general, the lookup table 312 stores VLC entries for all possible combinations of run values ranging from a minimum run to a maximum run and level values ranging from a minimum level to a maximum level. The minimum and maximum run and level values can be specified in accordance with the particular video encoding standard being employed. Given a particular run/level combination, the lookup table 312 can be addressed to read a corresponding VLC entry. Each of VLC entry includes an escape flag indicative of an escape mode. For a given VLC entry in the lookup table 312, if the escape flag is a first value, then the VLC entry includes a valid VLC code and bit length for particular run/level combination. If the escape flag is a second value, then the VLC entry does not include a valid VLC code and bit length. Rather, the particular run/level combination must be encoded using a fixed length VLC code formed from an escape code, the run, and the level. Each VLC entry may include a first word (first set of bits) representing a VLC code and a second word (second set of bits) representing a bit length for the VLC code. As described below, the flag may comprise a bit in the second word of each VLC entry.

Figure 4:
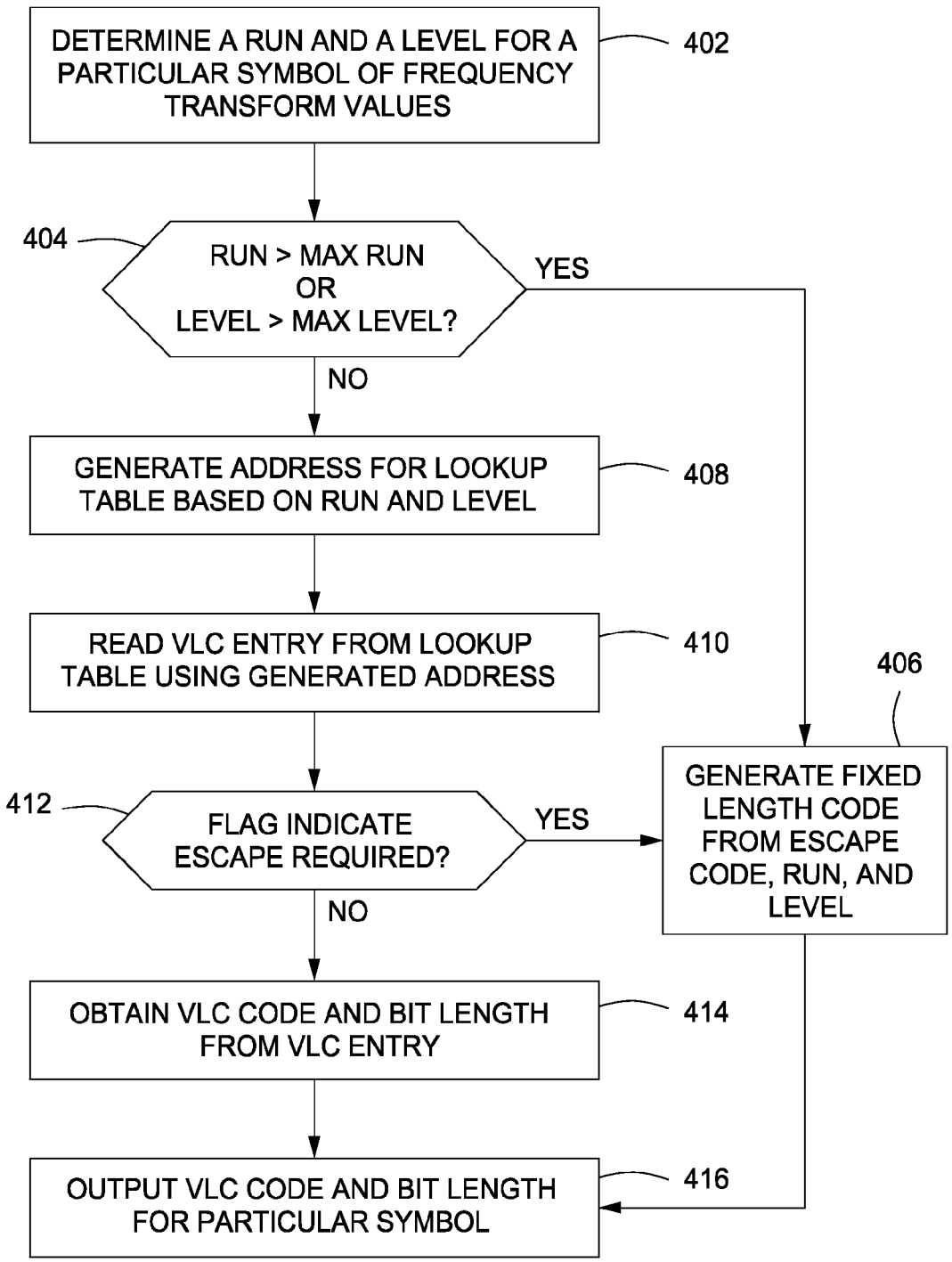
FIG. 4 is a flow diagram depicting an exemplary embodiment of a method of VLC encoding a symbol of frequency transform values having a run and a level in accordance with one or more aspects of the invention.

FIG. 4 is a flow diagram depicting an exemplary embodiment of a method 400 of VLC encoding a symbol of frequency transform values having a run and a level in accordance with one or more aspects of the invention. The method 400 may be performed using the VLC encoder 204 shown in FIGS. 2 and 3. The method 400 begins at step 402, where the VLC encoder 204 determines a run and a level for a particular symbol of frequency transform values. At step 404, a determination is made whether the run is greater than a maximum run value or whether the level is greater than the max level value. As noted above, maximum run and level values may be defined by the particular video standard being employed. If either the run or the level is greater than the respective maximum run or level values, the method 400 proceeds to step 406, where a fixed length VLC code is generated from an escape code, the run, and the level. The method 400 proceeds from step 406 to step 416. If at step 404 the run is less than or equal to the maximum run value and the level is less than or equal to the maximum level value, the method 400 proceeds to step 408.

At step 408, the processor 302 generates an address for the lookup table 312 in the memory 304 based on the run and the level. At step 410, the processor 302 reads a VLC entry from the lookup table 312 using the generated address. At step 412, a determination is made whether the flag in the VLC entry indicates an escape is required. As noted above, the flag may have a first value indicated that the VLC entry includes a valid VLC code and bit length, or a second value indicating that an escape is required. If an escape is required, the method 400 proceeds to step 406, described above. Otherwise, the method 400 proceeds to step 414. At step 414, a VLC code and a bit length is obtained from the VLC entry. At step 416, a VLC code and a bit length is output for the particular symbol. The method 400 may be repeated to process additional symbols of frequency transform coefficients such that the VLC encoder 204 produces a stream of VLC codes.

Aspects of the invention may be understood with respect to the following example. Assume that the video encoding system 200 employs the MPEG-2 standard of encoding as defined in ISO/IEC 13818 (ITU-T H.262). In MPEG-2, 8×8 blocks of frequency transform coefficients are produced and thus run values may range between 0 and 63. Quantization in MPEG-2 results in level values ranging between 1 and 2047. MPEG-2 defines specific VLC codes for particular run/level combinations. The minimum run value is 0, and the maximum run value is 31. The minimum level value is 1. The maximum level value is variable based on the particular run value. The following maximum level values are defined:

TABLE 1

| Run | Maximum Level |
|---|---|
| 0 | 40 |
| 1 | 18 |
| 2 | 5 |
| 3 | 4 |
| 4 to 6 | 3 |
| 7 to 16 | 2 |
| 17 to 31 | 1 |

For each run/level combination satisfying the above min/max constraints, MPEG-2 defines a particular VLC code and bit length. For each run/level combination that does not satisfy the above min/max constraints, MPEG-2 defines a 24-bit fixed VLC code of an escape code (0x00040000) concatenated with a 6 bit run value concatenated with a 12 bit level value.

The lookup table 312 may be configured to store VLC entries having the VLC codes and bit lengths defined by MPEG-2. FIG. 5 depicts an exemplary embodiment of a VLC entry 500 in accordance with one or more aspects of the invention. The VLC entry 500 includes a first word 502 and a second word 504. The first word 502 comprises the 8 most significant bits of the VLC entry 500, and the second word 504 comprises the 8 least significant bits of the VLC entry 500. The first word 502 is configured to represent a VLC code for a particular run/level combination. The second word 504 is configured to represent a bit length of the VLC code represented by the first word 502. While VLC codes defined in MPEG-2 may be 16 bits in length, those skilled in the art will appreciate that the 8-bit representation in the first word 502 and the bit length in the second word 504 can be configured such that a greater than 8-bit VLC code can be represented using only 8-bits in the first word 502. A greater than 8-bit VLC code can be derived from an 8-bit representation and the bit length in the second word 504. Notably, only 7-bits of the second word 504 are required to properly represent all of the VLC codes and corresponding bit lengths. Thus, according to one aspect of the invention, the 7 least significant bits of the word 504 are used to represent the bit length. The most significant bit of the word 504 is used to implement an escape flag 506. For example, a value of '0' for the escape flag 506 may indicate that the VLC entry 500 includes valid data in the words 502 and 504, whereas a value of '1' for the escape flag 506 may indicate that an escape is required.

FIG. 6 depicts an exemplary embodiment of the lookup table 312 in accordance with one or more aspects of the invention. The lookup table 312 includes VLC entry sets 602-0 through 602-31 (collectively VLC entry sets 602). The VLC entry sets 602-0 through 602-31 respectively correspond to run values 0 through 31. Each VLC entry set 602 includes VLC entries 604-0 through 604-40 (collectively VLC entries 604). For each VLC entry set 602, the VLC entries 604-1 through 604-40 correspond to level values 1 through 40. VLC entry 604-0 is unused, as the level value cannot be zero. Thus, the lookup table 312 may store a total of 1312 VLC entries, i.e., 41*32 VLC entries. Each of the VLC entries 604 may be formatted in accordance with the VLC entry 500 of FIG. 5.

Notably, in MPEG-2 as described above, for some run values, not every level value between 1 and 40 has a defined VLC code and bit length. As noted above, MPEG-2 only defines 113 VLC codes and bit lengths for a respective 113 different (run, level) combinations. Thus, only 113 VLC entries in the lookup table 213 include valid VLC codes and bit lengths. For example, for a run value of 1, only levels 1 through 18 have defined VLC codes and bit lengths. Thus, for VLC entry set 602-1, only VLC entries 604-1 through 604-18 include valid VLC codes and bit lengths. Accordingly, the escape flags for VLC entries 604-1 through 604-18 in the VLC entry set 602-1 are set to indicate valid data (no escape necessary). For VLC entries 604-19 through 604-40 in the VLC entry set 602-1, the escape flag is set to indicate invalid data, requiring an escape code. That is, MPEG-2 does not define VLC codes for a run value of 1, and level values between 19 and 40, so an escape code is required. In another example, VLC entry set 602-17 only includes one valid VLC entry 604-1 (run value 17, level value 1). VLC entries 604-2 through 604-40 in the VLC entry set 602-17 are invalid and their escape flags are set to indicate a required escape code. The remaining VLC entry sets 602 are configured similar in accordance with Table 1 set forth above. In this manner, a single lookup table can be used to hold the defined VLC codes, rather than multiple lookup tables.

Addresses for the lookup table 312 can be determined by generating an offset with respect to a base address in the memory 304. The base address may be an address of the VLC entry 604-0 in the VLC entry set 602-0 (i.e., the first VLC entry in the lookup table 312). The offset may be determined by computing the product of: (i) the run; and (ii) the maximum level plus one; and summing the product with the level. That is, offset=(run*41)+level.

Consider the following example: assume a symbol of frequency coefficients has a run of value 2, and a level of value 3. First, a determination is made whether the run value or level value exceeds the maximum run or level values (step 404). In the present example of MPEG-2, the maximum run value is 31 and the maximum level value is 40, so the present run and level values satisfy this constraint. Then, the processor 302 generates an address for the lookup table 312 given the particular (run, level) combination of (2, 3) (step 408). Assume the lookup table 312 is configured as shown in FIG. 6. The processor 302 can generate the address for the lookup table 312 in accordance with the offset equation above, i.e., offset=(2*41)+3=85. Thus, the address of the VLC entry for the (run, level) combination (2, 3) is the base address plus 85 addresses, i.e., the address of the VLC entry 604-3 in the VLC entry set 602-2. The processor 302 then reads data from the generated address to obtain the VLC entry 604-3 in the VLC entry set 602-2 (step 410). Since MPEG-2 defines a VLC code for the (run, level) combination (2, 3), the VLC entry 604-3 in the VLC entry set 602-2 includes an escape flag that indicates valid data (step 412). Thus, the processor 302 can obtain a valid VLC code and bit length from the obtained VLC entry (step 414), i.e., VLC code 0000 0010 11 with a 10-bit length (taken from Table B.14 in ISO/IEC 13818-2). Advantageously, the processor 302 was only required to perform a single load instruction for reading the VLC entry from the lookup table 312 based on the generated address.

Consider another example: assume a symbol of frequency coefficients has a run of value 19, and a level of value 10. First, a determination is made whether the run value exceeds the maximum run value (step 404). In the present example of MPEG-2, the maximum run value is 31, so the present run value satisfies this constraint. Then, the processor 302 generates an address for the lookup table 312 given the particular (run, level) combination of (19, 10) (step 408). Assume the lookup table 312 is configured as shown in FIG. 6. The processor 302 can generate the address for the lookup table 312 in accordance with the offset equation above, i.e., offset=(19*41)+10=789. Thus, the address of the VLC entry for the (run, level) combination (19, 10) is the base address plus 789 addresses, i.e., the address of the VLC entry 604-10 in the VLC entry set 602-19. The processor 302 then reads data from the generated address to obtain the VLC entry 604-10 in the VLC entry set 602-19 (step 410). Since MPEG-2 does not define a VLC code for the (run, level) combination (19, 10), the VLC entry 604-10 in the VLC entry set 602-19 includes an escape flag that indicates invalid data (step 412). Thus, the processor 302 generates a fixed VLC code from the escape code, the run, and the level, i.e., 0x0005300A in the present example (step 406). Again, the processor 302 was only required to perform a single load instruction for reading the VLC entry from the lookup table 312 based on the generated address.

FIG. 7 depicts another exemplary embodiment of the lookup table 312 in accordance with one or more aspects of the invention. In the embodiment of FIG. 6, a multiplication operation was required to compute the offset from the base address when addressing the lookup table 312, i.e., (run*(max level+1))+level. The embodiment of the lookup table 312 in FIG. 7 obviates the need for the multiplication operation to compute the address. Notably, the lookup table 312 includes VLC entry sets 702-0 through 702-31 (collectively VLC entry sets 702). The VLC entry sets 702-0 through 702-31 respectively correspond to run values 0 through 31. Each VLC entry set 702 includes VLC entries 704-0 through 704-63 (collectively VLC entries 704). For each VLC entry set 602, the VLC entries 704-1 through 704-40 correspond to level values 1 through 40. The VLC entries 704-41 through 704-63 in all of the VLC entry sets 702 are never addressed, since an escape code is automatically generated for any level greater than the maximum level value (e.g., 40). The VLC entries 704-41 through 704-63 in all of the VLC entry sets 702 may be set to any data or may remain unset. Thus, the lookup table 312 may store a total of 2048 VLC entries, i.e., 64*32 VLC entries. Each of the VLC entries 404 may be formatted in accordance with the VLC entry 500 of FIG. 5. However, since the VLC entry sets 702 are each 64 addresses long, the offset can be calculated with a simple shift instruction, rather than a multiplication instruction.

Using the methods described above, the number of load instructions executed by the processor 302 can be reduced to only a single load instruction. As noted above, when using the method 100 of FIG. 1, a standard definition (SD) video of 720×480 pixels at 30 frames per second with an average of 50% non-zero coefficients and being represented in 4:2:0 chrominance format requires 46,656,000 processor clock cycles to VLC encode one second of video. With the present invention, the same configuration results in 720×480×1.5×30×50%=7,776,000 coefficients×2 cycles/load instruction=15,552,000 processor clock cycles to VLC encode one second of video. Thus, the VLC encoding process of the invention provides an improvement in efficiency and processing cost as compared to the method 100 of FIG. 1.

Aspects of the invention have been described above with respect to implementing a VLC encoder using a processor coupled to a memory, where the processor executes a routine to perform the VLC encoding functions described. The processor is only required to execute a single load instruction from the memory in order to VLC encode a given symbol of frequency transform values. Those skilled in the art will appreciate that the present invention may also be used with different implementations of a VLC encoder, including implementations where the VLC encoder comprises a dedicated circuit, rather than a processor executing a routine. That is, the VLC encoder 204 may be implemented such that the processor 302 is a dedicated circuit that is designed to perform the VLC encoding functions described above. Although such a dedicated circuit implementation of the VLC encoder 204 would not have the processor 302 execute instructions, the present invention still provides a more efficient mechanism for VLC encoding, since the processor 302 is only required to access the lookup table once for a given symbol of frequency transform values.

For purposes of clarity by example, the above embodiments have been described with respect to MPEG-2 video encoding. Those skilled in the art will appreciate that the method 400, the VLC entry 500, and the lookup tables 600 and 700 may be modified to work with video encoding systems that employ other encoding standards, including other MPEG standards, such as MPEG-1 and MPEG-4.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method of variable length code (VLC) encoding a symbol of frequency transform values having a run and a level in a video encoding system, comprising:
generating, at a processor, an address for a lookup table stored in a memory based on the run and the level by generating an offset with respect to a base address by computing the product of: (i) the run; and (ii) the maximum level plus one; and summing the product with the level, the lookup table storing VLC entries for all possible combinations of run values ranging from a minimum run to a maximum run and level values ranging from a minimum level to a maximum level, each of the VLC entries including a flag indicative of an escape mode;
reading a VLC entry from the lookup table using the address;
obtaining a VLC code and bit length from the VLC entry if the flag in the VLC entry is a first value; and
generating a fixed length VLC code from an escape code, the run, and the level if the flag in the VLC entry is a second value,
wherein the minimum run is 0, the maximum run is 31, the minimum level is 1, and the maximum level is 40, and wherein the lookup table stores 1312 VLC entries.

2. The method of claim 1, wherein the minimum run is 0, the maximum run is 31, the minimum level is 1, and the maximum level is 40, and wherein the lookup table stores 64 VLC entries for each run value between 0 and 31 for a total of 2048 VLC entries.

3. The method of claim 2, wherein the step of generating the address comprises:
generating an offset with respect to a base address by shifting the run and summing the shifted run with the level.

4. The method of claim 1, wherein each of the VLC entries includes first bits for representing a VLC code and second bits for representing a bit length, and wherein the flag comprises a bit of the second bits.

5. The method of claim 1, further comprising:
determining whether the run is greater than the maximum run or the level is greater than the maximum level prior to generating the address;
generating the fixed length VLC code from the escape code, the run, and the level if the run is greater than the maximum run or the level is greater than the maximum level; and
performing the steps of generating the address, reading the VLC entry, and obtaining the VLC code or generating the fixed length VLC code if the run is less than or equal to the maximum run and the level is less than or equal to the maximum level.

6. Apparatus for variable length code (VLC) encoding of a symbol of frequency transform values having a run and a level in a video compression system, comprising:
a memory having a lookup table configured to store VLC entries for all possible combinations of run values ranging from a minimum run to a maximum run and level values ranging from a minimum level to a maximum level, each of the VLC entries including a flag indicative of an escape code; and
a processor, coupled to the memory, configured to generate an address for the lookup table based on the run and the level by generating an offset with respect to a base address by computing the product of: (i) the run; and (ii) the maximum level plus one; and summing the product with the level, read a VLC entry from the lookup table using the address, obtain a VLC code and bit length from the VLC entry if the flag in the VLC entry is a first value; and generate a fixed length VLC code from an escape code, the run, and the level if the flag in the VLC entry is a second value,
wherein the minimum run is 0, the maximum run is 31, the minimum level is 1, and the maximum level is 40, and wherein the lookup table stores 1312 VLC entries.

7. The apparatus of claim 6, wherein the minimum run is 0, the maximum run is 31, the minimum level is 1, and the maximum level is 40, and wherein the lookup table stores 64 VLC entries for each run value between 0 and 31 for a total of 2048 VLC entries.

8. The apparatus of claim 7, wherein the processor is configured to generate the address by generating an offset with respect to a base address by shifting the run and summing the shifted run with the level.

9. The apparatus of claim 6, wherein each of the VLC entries includes first bits for representing a VLC code and second bits for representing a bit length, and wherein the flag comprises a bit of the second bits.

10. The apparatus of claim 6, wherein the processor is configured to execute only one load instruction to read the VLC entry from the lookup table.

11. A video compression system, comprising:
frequency transform/motion prediction logic configured to produce frequency transform values from video data; and
a variable length code (VLC) encoder, coupled to the encoder logic, configured to encode symbols of the frequency transform values each having a run and a level, the VLC encoder including:
a lookup table configured to store VLC entries for all possible combinations of run values ranging from a minimum run to a maximum run and level values ranging from a minimum level to a maximum level, each of the VLC entries including a flag indicative of an escape code; and a processor configured to, for each symbol of the symbols: generate an address for the lookup table based on the run and the level of the symbol by generating an offset with respect to a base address by computing the product of: (i) the run; and (ii) the maximum level plus one; and summing the product with the level, read a VLC entry from the lookup table using the address, obtain a VLC code and bit length from the VLC entry if the flag in the VLC entry is a first value; and generate a fixed length VLC code from an escape code, the run of the symbol, and the level of the symbol if the flag in the VLC entry is a second value, wherein the minimum run is 0, the maximum run is 31, the minimum level is 1, and the maximum level is 40, and wherein the lookup table stores 1312 VLC entries.

12. The system of claim 11, wherein the minimum run is 0, the maximum run is 31, the minimum level is 1, and the maximum level is 40, and wherein the lookup table stores 64 VLC entries for each run value between 0 and 31 for a total of 2048 VLC entries.

13. The system of claim 12, wherein the control logic is configured to generate the address by generating an offset with respect to a base address by shifting the run and summing the shifted run with the level.

14. The system of claim 11, wherein each of the VLC entries includes first bits for representing a VLC code and second bits for representing a bit length, and wherein the flag comprises a bit of the second bits.

\* \* \* \* \*